United States Patent
Duncan et al.

(10) Patent No.: US 9,754,985 B1
(45) Date of Patent: Sep. 5, 2017

(54) INTERFEROMETER ARRAY IMAGING SYSTEM USING PHOTONIC INTEGRATED CIRCUIT CARDS

(71) Applicant: Lockheed Martin Corporation, Bethesda, MD (US)

(72) Inventors: Alan L. Duncan, Sunnyvale, CA (US); Richard L. Kendrick, San Mateo, CA (US); David M. Stubbs, Mountain View, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 236 days.

(21) Appl. No.: 14/198,520

(22) Filed: Mar. 5, 2014

Related U.S. Application Data

(60) Provisional application No. 61/773,730, filed on Mar. 6, 2013.

(51) Int. Cl.
*G02B 6/26* (2006.01)
*H01L 27/146* (2006.01)

(52) U.S. Cl.
CPC .............................. *H01L 27/14627* (2013.01)

(58) Field of Classification Search
CPC ................ G01N 2021/7779; A61B 2019/5217
USPC ......... 250/221, 216, 227.11, 227.14, 227.24, 250/227.28, 227.2, 208.2, 226, 2, 39; 356/450, 477, 478, 484, 402, 416, 419; 382/2, 8, 10, 14, 31, 33, 37, 116
See application file for complete search history.

(56) References Cited

U.S. PATENT DOCUMENTS

| | | | | |
|---|---|---|---|---|
| 5,377,287 | A * | 12/1994 | Lee ...................... | G02B 6/2848 385/31 |
| 5,815,624 | A * | 9/1998 | Rosenberg ................ | B60R 1/00 385/115 |
| 6,445,448 | B1 * | 9/2002 | Melman ........... | G01N 27/44721 356/246 |
| 7,345,312 | B2 * | 3/2008 | Kazakevich ......... | A61B 1/0607 257/79 |
| 2006/0141649 | A1 * | 6/2006 | Joyner ............... | G02B 6/12011 438/31 |

OTHER PUBLICATIONS

Fontaine, et al., *Near quantum-limited, single-shot coherent arbitrary optical waveform measurements*, Optics Express, 17, 12332-12344 (2009).

(Continued)

*Primary Examiner* — Kevin Pyo
(74) *Attorney, Agent, or Firm* — McDermott Will & Emery LLP

(57) ABSTRACT

An imaging system can include of a plurality of pairs of lenslets and a respective plurality of two-dimensional arrays of photonic waveguides arranged in a respective plurality of photonic integrated circuits. Each waveguide can collect light in an airy-disk-size bin to cover a full field of view of the lenslet. Light from each pair of respective waveguides from each pair of lenslets can be demultiplexed into wavelength bins and combined with appropriate phase shifts to enable a measurement of the complex visibility. The complex visibilities from all of the measurements then can be processed to form an image.

20 Claims, 15 Drawing Sheets

(56) References Cited

OTHER PUBLICATIONS

Takiguchi, et al., *Flexible pulse waveform generation using silica-waveguide-based spectrum synthesis circuit*, Electron. Lett., 40, 537-538 (2004).

Mandai, et al., *Arbitrary optical short pulse generator using a high-resolution arrayed-waveguide grating*, IEEE Topical Meeting on Microwave Photonics, (2004), pp. 107-110.

Jiang, et al., *Optical arbitrary waveform processing of more than 100 spectral comb lines*, Nature Photon., 1, 463-467 (2007).

Scott, et al., *Rapid updating of optical arbitrary waveforms via time-domain multiplexing*, Opt. Lett., 33, 1068-1070 (2008).

Dorrer, *High-speed measurements for optical telecommunication systems*, IEEE J. Sel. Top. Quantum Electron., 12, 843-858 (2006).

Li, *Recent advances in coherent optical communication*, Adv. Opt. Photon., 1, 279-307 (2009).

Yu, et al., *Multilevel modulations and digital coherent detection*, Opt. Fiber Technol., 15, 197-208 (2009).

Hale, et al., *The Berkeley Infrared Spatial Interferometer: A Heterodyne Stellar Interferometer for the Mid-Infrared*, The Astrophysical Journal, 537, 998 (2000).

Taylor, *Coherent detection method using DSP for demodulation of signal and subsequent equalization of propagation impairments*, IEEE Photon. Technol. Lett., 16, 674-676 (2004).

Kazovsky, et al., *Wide-linewidth phase diversity homodyne receivers*, J. Lightwave Technol., 6, 1527-1536 (1988).

Davis, et al., *Phase diversity techniques for coherent optical receivers*, J. Lightwave Technol., 5, 561-572 (1987).

Savory, et al., *Electronic compensation of chromatic dispersion using a digital coherent receiver*, Opt. Express, 15, 2120-2126 (2007).

Kikuchi, *Electronic post-compensation for nonlinear phase fluctuations in a 1000-km 20-Gbit/s optical quadrature phase-shift keying transmission system using the digital coherent receiver*, Opt. Express, 16, 889-896 (2008).

Fontaine, et al., *Real-time full-field arbitrary optical waveform measurement*, Nature Photonics, 4, 248-254 (2010).

Yuen, et al., *Noise in homodyne and heterodyne detection*, Opt. Lett., 8, 177-179 (1983).

Schumaker, *Noise in homodyne detection*, Opt. Lett., 9, 189-191 (1984).

Quinlan, et al., *Harmonically mode-locked semiconductor-based lasers as high repetition rate ultralow noise pulse train and optical frequency comb sources*, J. Opt.. A: Pure Appl. Opt., 11, 103001 (2009).

Fontaine, et al., "Real-time full-filed arbitrary optical waveform measurement," Nature Photonics, 2010, pp. 248-254, vol. 14.

Guyon, "Wide field interferometric imaging with single-mode fibers," A&A, 2002, pp. 366-378, vol. 387.

Thiébaut, et al., "Image reconstruction in optical interferometry," IEEE Signal Processing Magazine, 2010, pp. 97-109, vol. 27, No. 1.

\* cited by examiner

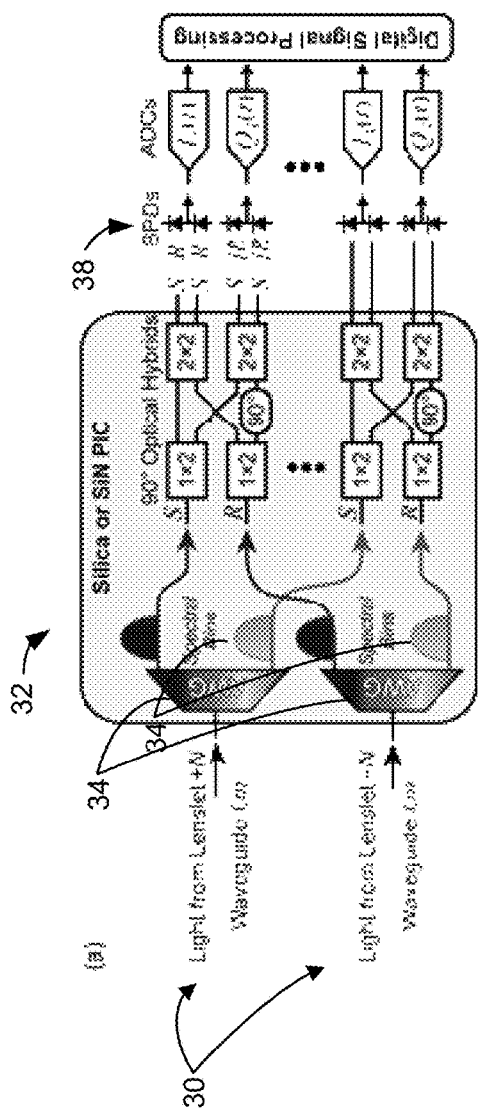
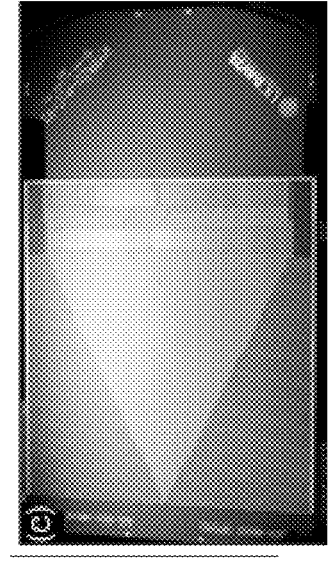
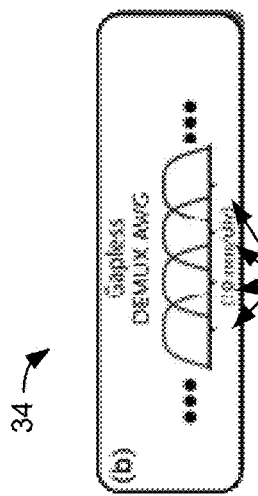
FIG. 2A
FIG. 2B
FIG. 2C

INTERFEROMETER ARRAY IMAGING SYSTEM USING PHOTONIC INTEGRATED CIRCUIT CARDS

CROSS-REFERENCE TO RELATED APPLICATIONS

This application claims the priority benefit of U.S. Provisional Application No. 61/773,730, filed on Mar. 6, 2013, which is hereby incorporated by reference in its entirety for all purposes.

STATEMENT REGARDING FEDERALLY SPONSORED RESEARCH OR DEVELOPMENT

Not applicable.

FIELD

The present disclosure relates generally to imaging systems and more particularly, for example, without limitation, electro-optical (EO) imaging detectors.

BACKGROUND

Traditional electro-optical imaging payloads consist of an optical telescope to collect the light from the object scene and map the photons to an image plane to be digitized by a focal plane detector array. The size, weight, and power (SWaP) for the traditional EO imager is dominated by the optical telescope, driven primarily by the large optics, large stiff structures, and the thermal control needed to maintain precision free-space optical alignments. These factors drive the cost, which scales as 2.5× the optical telescope aperture diameter.

The description provided in the background section, including without limitation, any problems, features, solutions or information, should not be assumed to be prior art merely because it is mentioned in or associated with the background section. The background section may include information that describes one or more aspects of the subject technology.

SUMMARY

According to some embodiments, a non-traditional imaging detector system is provided that has a substantially reduced SWaP. For example, in some embodiments, the SwaP can be reduced by at least an order of magnitude. Some embodiments can maximize performance by providing a large effective diameter (resolution) while minimizing mass and cost. Further, in some embodiments, instead of the traditional optical telescope and digital focal plane detector array, the imager can comprise a densely packed interferometer array based on photonic integrated circuit (PIC) technologies that sample the object being imaged in the spatial-frequency domain and then reconstruct an image.

In some embodiments, an imaging system is disclosed that comprises a plurality of interferometers arranged in a plane so as to measure at least one of an amplitude and a phase of a visibility function at spatial frequencies of a synthetic aperture of the imaging system.

In accordance with some embodiments, and in contrast to existing data processing equipment, the system can be configured to process broadband light (instead of coherent light). Accordingly, an aspect of some embodiments is the realization that to process broadband light, light cannot simply be shone onto a fiber optic or waveguide; light must be properly processed and handled in order to inject or direct the light into a fiber optic or microchip. Accordingly, some embodiments disclosed herein provide a system that comprises one or more lenslets and a PIC card. Further, some embodiments can comprise an array waveguide grating (AWG) built into the PIC card that can be configured to split light into spectral bins.

In some embodiments, an imaging system is disclosed that comprises a plurality of pairs of lenslets and a plurality photonic waveguides. The lenslets can couple light from an object with a respective plurality of waveguides on a PIC. In some embodiments, the waveguides can be arranged as a two-dimensional array. Light from each lenslet can be distributed among different waveguides by both field angle and optical frequency. Further, the lenslets can be paired up to form unique interferometer baselines by combining light from different waveguides.

In some embodiments, the waveguides can be arranged at a respective plurality of image planes. In each plane, each waveguide can collect light in an airy-disk-size bin to cover the full field of view of the lenslet, and wherein light from each pair of respective waveguides from each pair of lenslets are demultiplexed into wavelength bins and combined with appropriate phase shifts to enable a measurement of the complex visibility.

According to some embodiments, the complex spatial coherence of the object (for each field angle, frequency, and baseline) can be measured with a balanced four quadrature detection scheme. By the Van-Cittert Zernike Theorem, each measurement can correspond to a unique Fourier component of the incoherent object intensity distribution. Finally, an image reconstruction algorithm can be used to invert all the data and form an image. Thus, in some embodiments, while interferometric imaging is typically performed with point source objects, the waveguide can effectively serve as a field stop when viewing extended scenes. For example, the intensity distribution can be apodized by the waveguide coupling efficiency in the object plane.

Implementations of some of the embodiments disclosed herein can advantageously replace the large optics and structures required by a conventional telescope with PICs that are accommodated by standard lithographic fabrication techniques (e.g., Complementary metal-oxide-semiconductor (CMOS) fabrication). The standard EO payload integration and test process which involves precision alignment and test of optical components to form a diffraction limited telescope, therefore, can be replaced by in-process integration and test as part of the PIC fabrication that substantially reduces associated schedule and cost. The low profile and low SWaP of an imaging system, according to some embodiments, enables high resolution imaging with a payload that is similar in size and aspect ratio to a solar panel. Such embodiments can allow high resolution, low cost options for space-based space surveillance telescopes. The low SWaP design can enable hosted payloads, cubesat designs, as well as traditional bus options that are lower cost.

In accordance with some embodiments, an optical imaging system can be provided that comprises a plurality of lenslet assemblies, a plurality of waveguides, and a plurality of detectors. Each lenslet assembly can be configured to receive broadband light and focus the light onto a focus point. Each waveguide can comprise a proximal end disposed at the focus point of a respective lenslet assembly. Each waveguide can define an optical path for propagation of the light. The plurality of detectors can be disposed along the optical path and configured to receive and measure the light.

The system can further comprise a plurality of arrayed waveguide gratings, upstream of the plurality of detectors, for separating the light propagated from each lenslet assembly into separate spectral bins. Light from the separate spectral bins can be propagated through respective waveguides toward the plurality of detectors.

The system can be configured such that each of the plurality of waveguides is integrated into a microchip. The microchip can comprise a photonic integrated circuit. Each lenslet assembly can be configured such that the focus point is on an edge of the microchip. The plurality of waveguides can be integrated into a plurality of microchips. The plurality of detectors can be integrated into the microchip.

In some embodiments, the plurality of lenslet assemblies can be disposed in an array. For example, the plurality of lenslet assemblies can be disposed in a linear, planar, or three-dimensional array. Further, each lenslet assembly can comprises a first lens, and each first lens can be disposed in a planar array. Furthermore, each first lens can be oriented in a three-dimensional array.

Each lenslet can propagate the light along a respective optical axis, and at least a distal portion of each waveguide can be aligned along the respective optical axis of a corresponding lenslet assembly. The optical axes of the plurality of lenslet assemblies can be oriented parallel relative to each other. Further, in some embodiments, the optical axes of the plurality of lenslet assemblies can be oriented skew relative to each other, such as to converge at a central point.

In some embodiments, an optical imaging system is provided that can comprise a housing, a plurality of lenslet assemblies, a plurality of waveguides, and a plurality of detectors. The housing can have a longitudinal axis. The plurality of lenslet assemblies can each be aligned along respective optical axes being oriented parallel relative to the longitudinal axis. The plurality of lenslet assemblies can be configured to receive broadband light and to focus the light toward a focal plane. Each waveguide can have a distal end positioned at the focal plane and configured to receive the light from a respective lenslet assembly. The plurality of detectors can be disposed along the optical axes for receiving and measuring the light.

The system can further comprise a plurality of microchips, and each microchip can comprise a plurality of waveguides. Each microchip can be substantially planar and extend substantially parallel relative to the longitudinal axis.

In some embodiments, the housing can comprise a cylindrical shape. The plurality of lenslet assemblies can be oriented in a plurality of rows extending radially outwardly within the housing. Further, the plurality of rows can be substantially linear. In addition, a plurality of microchips can be positioned with respective edges thereof along the focal plane and in optical communication with the plurality of rows of the plurality of lenslet assemblies.

In accordance with some embodiment, methods of optical imaging are also provided. For example, a method of optical imaging can comprise: collecting broadband light using a pair of lenslets; focusing the light onto a focal point such that the light is propagated into a plurality of waveguides disposed in a photonic integrated circuit; dividing the broadband light propagated through each waveguide into a plurality of spectral bins using an arrayed waveguide grating; and directing the light onto a plurality of detectors to measure the light. Further, the method can also comprise combining the light from the pair of lenslet assemblies; and interfering the light from the pair of lenslet assemblies.

In some embodiments, the method can further comprise conforming the optical array to a two-dimensional surface. In addition, the method can comprise conforming the optical array to a three-dimensional surface.

The description in this summary section may provide some illustrative examples of the disclosure. This section is not intended to be a broad overview or to identify essential elements of the disclosure.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings:

FIG. 2A is a diagram of an imaging system, according to some embodiments.

FIG. 2B is a schematic view of an arrayed waveguide grating, according to some embodiments.

FIG. 2C is a perspective view of a photonic integrated circuit, according to some embodiments.

DETAILED DESCRIPTION

The following description discloses embodiments of an imaging system having a planar interferometer array that samples the received image in the spatial-frequency domain and then reconstructs an image.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Elements of a system may be referred to in general using a reference number, for example "126," and individual elements of that type referred to using the same reference number with an alphabetical suffix, for example "126A," "126B," and "126C."

In accordance with some embodiments, an optical imaging system and methods of imaging are provided. Such systems and methods can incorporate aspects of interferometer imaging techniques. Some of these techniques, as well components or features related to the optical image system disclosed herein are disclosed in patent application Ser. No. 13/443,828, filed on Apr. 10, 2012, U.S. Provisional Patent App. No. 61/474,668, filed on Apr. 12, 2011, U.S. Provisional Patent App. No. 61/773,698, filed on Mar. 6, 2013, and U.S. patent application Ser. No. 14/198,505, filed on Mar. 5, 2014, the entireties of which are incorporated herein by reference.

Figure 1:
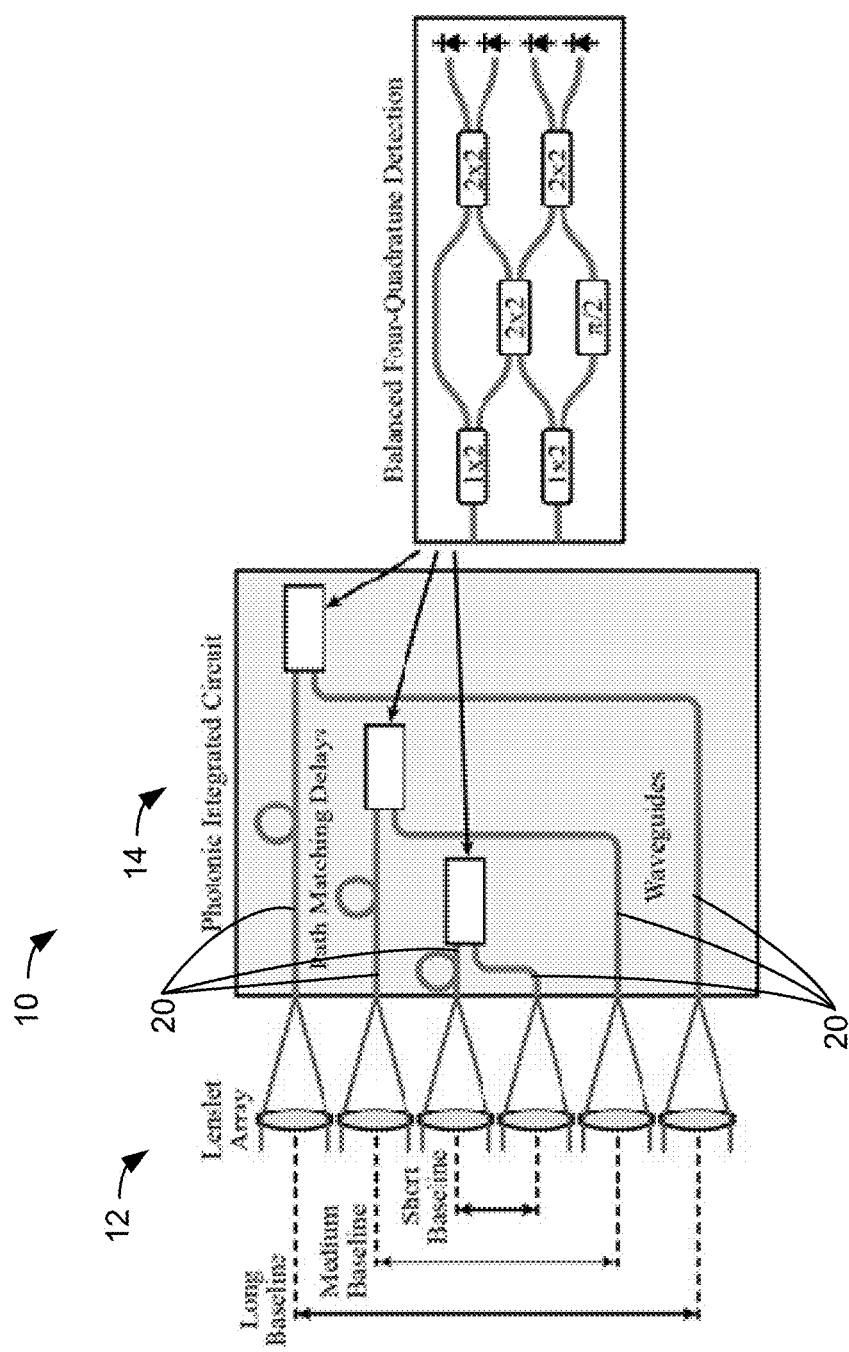
FIG. 1 is a diagram of an imaging system, according to some embodiments.

The system can comprise a plurality of interferometers. In some embodiments, the system can comprise a plurality of interferometers arranged in a preset two-dimensional or three-dimensional pattern. For example, FIG. 1 illustrates a diagram of a one dimensional array 10 of interferometers. The interferometers can comprise a Michelson interferometer. As shown, three pairs of lenslets 12 can be combined to form interference fringes or three interferometer baselines. In accordance with some embodiments, each pair of lenslets 12 can provide phase and amplitude for one point in the image u-v frequency plane.

The lenslets 12 can be coupled into a waveguide embedded into a circuit or microchip, such as Photonic Integrated Circuit (PIC) 14. The PIC 14 can contain path matching delays and arrayed waveguide gratings for multiple spectral channels 20. In accordance with some embodiments, the path matching delays can be used to equalize the pathlengths between lenslets 12. Further, balanced four quadrature detectors can be used to measure amplitude and phase for each spectral channel. The spectral channels are not illustrated in the figure, but can be placed prior to the path matching delays.

FIGS. 2A-2C illustrate features of a PIC, which for simplicity, is illustrated as combining light from two lenslets. FIG. 2A illustrates a generalized diagram of an embodiment of a system comprising a lenslet pair 30 (illustrated diagrammatically) and associated components that can be etched into a Silica or Silicon Nitride PIC 32. The PIC 32 can comprise other suitable materials, such as ZnSe, that can be used as a substrate for infrared wavelength regimes.

In accordance with some embodiments, the system can be configured such that the PIC 32 comprises one or more Arrayed Waveguide Gratings (AWG) 34, as shown in FIG. 2B. The AWG 34 can split each channel into four wavelength bins 34 that are each 50 GHz wide. In accordance with some embodiments, the system can comprise a plurality of Balanced Photo-Detectors (BPDs) 38 that can be butt-coupled to the PIC 32.

FIG. 2C illustrates a photograph of an example PIC 40 that contains 16 input channels. However, the system can also be configured such that the PIC comprises more or less than 16 channels. For example, the PIC can comprise 8, 32, 64, or 128 channels.

As noted above, in some embodiments, the system can comprise a plurality of interferometers that are arranged in a linear array, as shown in FIG. 1. However, in some embodiments, the interferometers can be arranged in a nonlinear arrays, two-dimensional patterns, or three-dimensional patterns.

Figure 3:
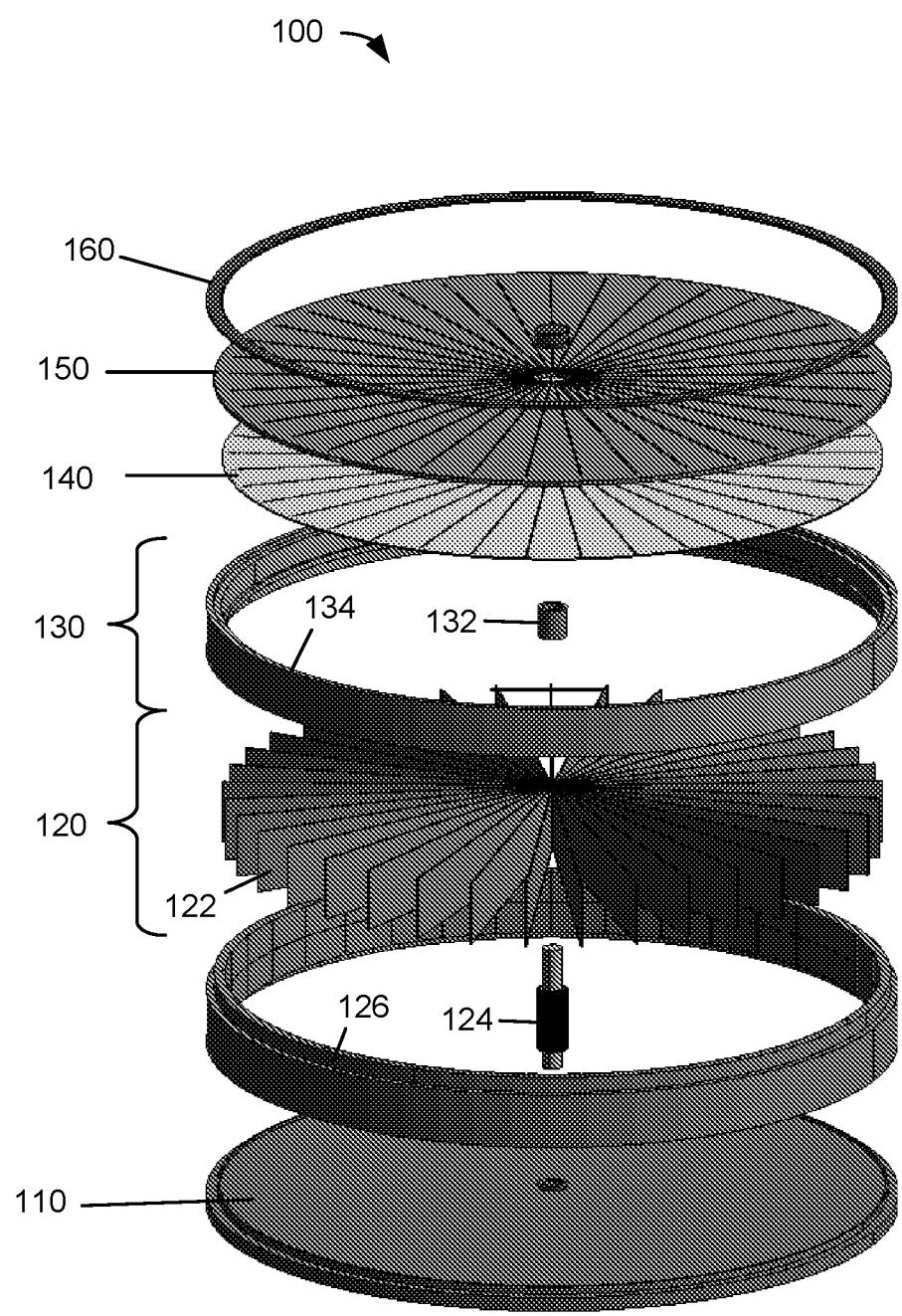
FIG. 3 is an exploded view of an imaging system, according to some embodiments.
Figure 4A:
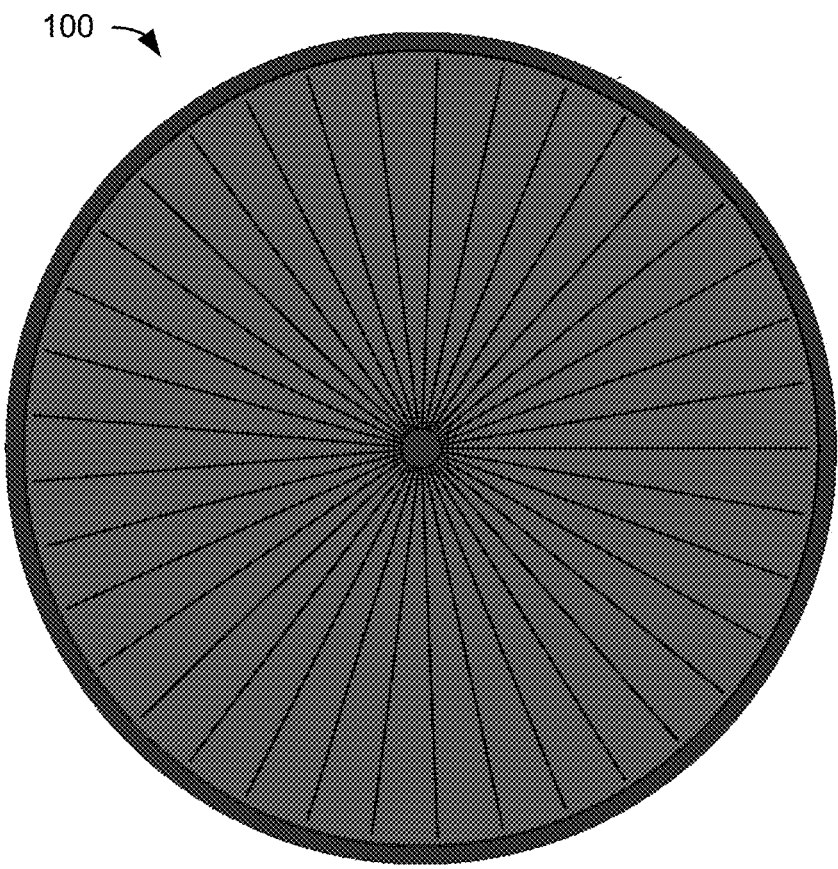
FIGS. 4A-4B are top and side views of the imaging system of FIG. 3 in an assembled state, according to some embodiments.
Figure 4B:
Figure 5:
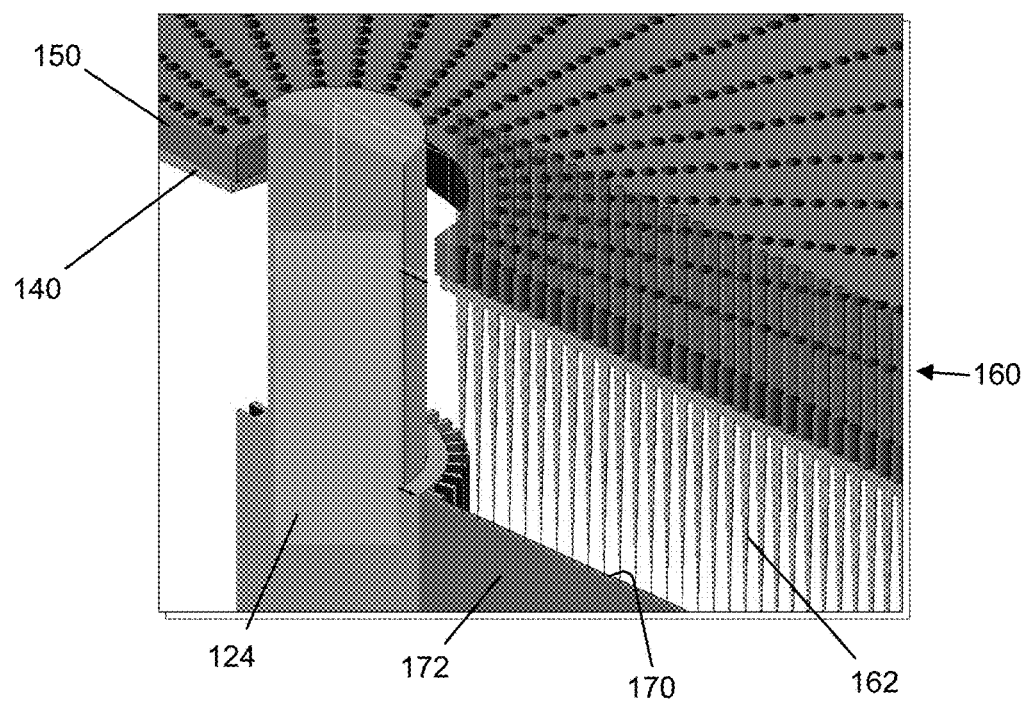
FIG. 5 is a perspective cut-away view of elements of the imaging system of FIG. 3, according to some embodiments.

Referring to FIGS. 3-5, the system can comprise a plurality of linear arrays that can be arranged to form an imaging device. As discussed further below, in some embodiments, the system can be configured such that each row of lenslets is coupled into an edge of a PIC that is positioned below the lenslets.

FIG. 3 is an exploded view of an exemplary imaging system 100 according to certain aspects of the present disclosure. The system 100 can comprise a plurality of lenslet arrays that are optically aligned with at least one PIC. FIG. 3 illustrates an embodiment in which the system 100 comprises, from rear to front, a rear mounting plate 110, a plurality 120 of PIC cards 122, a spacer assembly 130 having an inner spacer 132 and an outer spacer 134, a lenslet array 140, and an entrance baffle plate 150 with a retainer ring 160. The plurality 120 of PIC cards can be held in position by a center hub 124 and an outer mounting ring 126, which can comprise corresponding engagement features, such as grooves or protrusions that can engage with the PIC cards 122 for positioning the PIC cards therein.

In accordance with some embodiments, the system 100 can function as or replace a traditional optical telescope and digital focal plane detector array with a densely packed interferometer array based on emerging PIC technologies that sample the object being imaged in the Fourier domain, i.e., spatial frequency domain, and then reconstructs an image. When compared to traditional large optics and structures required by conventional telescopes, such embodiments can advantageously provide more compact assemblies that can incorporate PIC cards accommodated by standard lithographic fabrication techniques, e.g., CMOS fabrication. The standard EO payload integration and test process, which involves precision alignment and test of optical components to form a diffraction limited telescope, can be replaced by in-process integration and test as part of the PIC fabrication that substantially reduces associated schedule and cost.

Additionally, in some embodiments, the system 100 can comprise an EO sensor. The EO sensor can comprise millions of direct-detect white-light interferometers to measure the amplitude and phase of the visibility function at spatial frequencies that span the full synthetic aperture of the telescope. The conventional approach for imaging interferometers, such as the Naval Prototype Optical Interferometer (NPOI) at Flagstaff, requires complex mechanical delay lines to form the interference fringes resulting in designs that are not traceable to more than a few simultaneous spatial frequency measurements.

In contrast, some embodiments of the system 100 can achieve this traceability by employing sub-micron-scale waveguides or nano-photonic switches. Further, in accordance with some embodiments, the sub-micron-scale waveguides or nano-photonic switches can be fabricated in one or more silicon microchips having micron-scale packing density to form the delay lines and beam combiners.

In some embodiments, the detectors and electronics may be embedded in the same microchip. In some embodiments, a telescope can be provided as a three-dimensional silicon microchip with a top layer consisting of lenslet arrays, nano-photonic delay lines, phase modulators, and beam combiners. Further, the silicon microchip can comprise a second layer consisting of detectors and readout electronics. Furthermore, the silicon microchip can also comprise a third layer that processes the raw data and outputs image data.

In accordance with some embodiments, the microchip can have a sub-micron scale, such as less than 1 micron or about 0.50 microns. Advantageously then, various embodiments can be configured such that the system does not include moving parts or large, heavy optics. In some embodiments, multiple imaging systems may be connected with optical fiber interconnects external to the microchip. In some embodiments, the system 100 can also provide the ability to process the signals from the plurality of interferometric detectors so as to image through near-field turbulence.

FIGS. 4A-4B are top and side views of the assembled imaging system 100, according to some embodiments. The system 100 can have an outer diameter of between about 300 mm and about 600 mm, between about 400 mm and about 500 mm, or about 440 mm. In some embodiments, the imaging system 100 can have a total height (along its central axis or front to back) of between about 60 mm and about 100 mm, between about 70 mm and about 90 mm, or about 78 mm.

FIG. 5 is a perspective cross-sectional view of the assembled imaging system 100. As illustrated, the entrance baffle plate 150 can comprise a plurality of apertures through which light 160 passes toward the lenslet array 140. After passing through the lenslet array 140, the beam paths 162 of the lights can be focused onto an edge 170 of a PIC card 172. For simplicity, only a single row of paths of the light beams 160 are illustrated in FIG. 5. However, as will be understood by person skilled in the art, the focusing of the light beams 160 onto the edge 170 of the PIC card 172 can be performed using other lenslet arrays and apertures of the baffle plate 150.

Further, as noted above, other configurations of the baffle plate 150 and/or lenslet array 140 can be provided in which one or both of these components comprises a two-dimensional or three-dimensional shape. Further, some embodiments can be provided that comprise the lenslet array 140 by itself, without the baffle plate 150.

Figure 6:
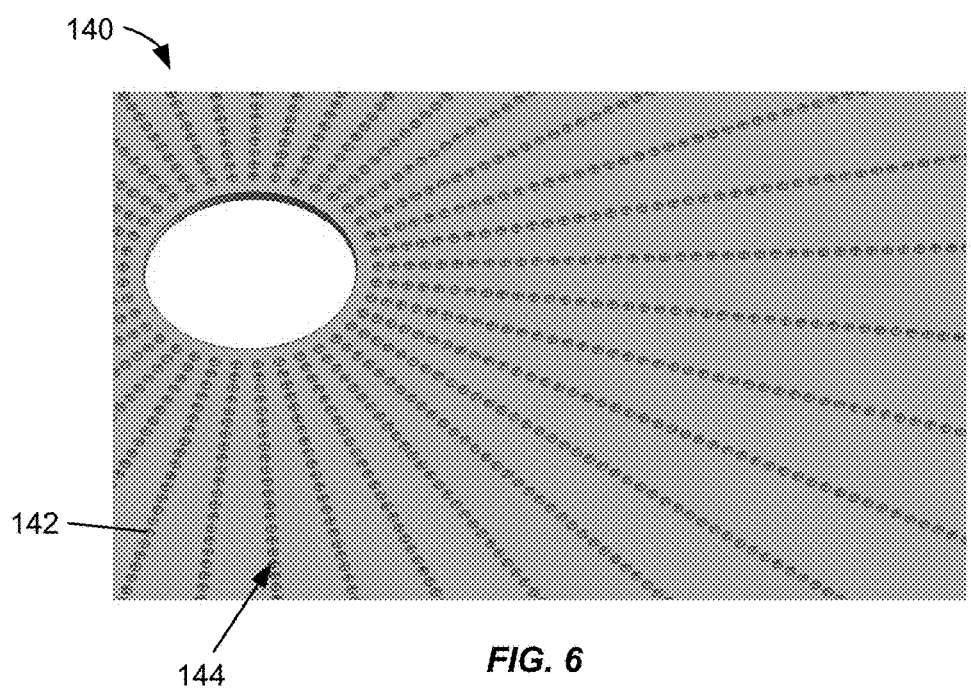
FIG. 6 is an enlarged perspective view of a lenslet array of the imaging system of FIG. 3, according to some embodiments.

FIG. 6 is an enlarged perspective view of an exemplary lenslet array 140, in accordance with some embodiments. As illustrated in FIG. 6, in some embodiments, the lenslets 142 can be arranged in radial rows 144 with a uniform spacing. In other embodiments, other arrangements and/or a variable spacing may be used.

In accordance with some embodiments, the lenslet array 140 can comprise a planar array of lenslets 142 or interferometers arranged in linear u-v plane. For example, the lenslets 142 can be arranged in a virtual Fourier plane, having a radially extending pattern of rows of lenslets 142 similar to the shape of a Ferris wheel.

In some embodiments, the system 100 can be configured such that each planar array 140 comprises a series of rows 144 that each includes 130 lenslets 142. The 130 lenslets 142 can be paired to form interferometer baselines. Further, some embodiments can also comprise 37 rows 144 or u-v slices, wherein each row 144 or slice as a rotational offset of about 9.5° relative to the adjacent rows or slices. Accordingly, in such embodiments, the spacing of the rows 144 can tend to uniformly fill the spatial frequencies of the u-v plane.

In addition, in some embodiments, the system 100 can be configured such that the edge 170 of the PIC card 172 is positioned at the lenslet image plane (the location onto which a beam of light 160 is focused along its beam path 162). The PIC card 172 can be aligned with optical axes of the lenslets 142. Accordingly, in some embodiments, for each lenslet 142 and the light beam passing through the respective lenslet 142, an optical axis, longitudinal axis, or propagation axis of the light 160, as focused into the beam 162, can be coincident with or aligned with an entrance aperture of a waveguide on the PIC card 172 such that light passing through each lenslet 142 can be focused and directed into a waveguide aperture and thereby pass through the respective waveguides for further processing in the PIC card 172.

For example, the PIC card 172 can comprise a two-dimensional array of 24×24 photonic waveguides (which can comprise a spacing, e.g., of about 25 micrometers). In accordance with some embodiments, the waveguides can thereby collect light to cover a full field of view of system 100. The waveguides can collect light in Airy-disk-size bins.

For example, the light from each pair of waveguides from lenslets that form an interferometer pair can be demultiplexed into wavelength bins and combined with appropriate phase shifts to enable a measurement of the complex visibility. Each waveguide can collect light from a field point in the scene and common points in the scene from pairs of lenslets can be combined to create fringes in a balanced four-quadrature receiver. The phase and amplitude can be recorded for each field point and each lenslet pair which form a baseline. The various baseline data can be placed in the u-v plane array at the proper location in order to reconstruct the scene that is being imaged. Each wavelength bin can provide a unique spatial frequency to further fill the u-v plane. The complex visibilities from all the measurements can be processed then to form an image.

In some embodiments, the lenslets 142 may include 1 mm diameter f18 lenses. In some embodiments, the diameter of the innermost ring of lenslets can be between about 20 mm and about 30 mm, between about 22 mm and about 28 mm, or about 24 mm. In certain embodiments, the lenslet array 140 can comprise between about 100 and about 200 lenslets, between about 110 and about 150 lenses, or about 130 lenslets in each row. Further, the lenslets can be spaced at a spacing of between about 1 mm and about 5 mm, between about 1.2 mm and about 3 mm, or about 1.5 mm.

Figure 7:
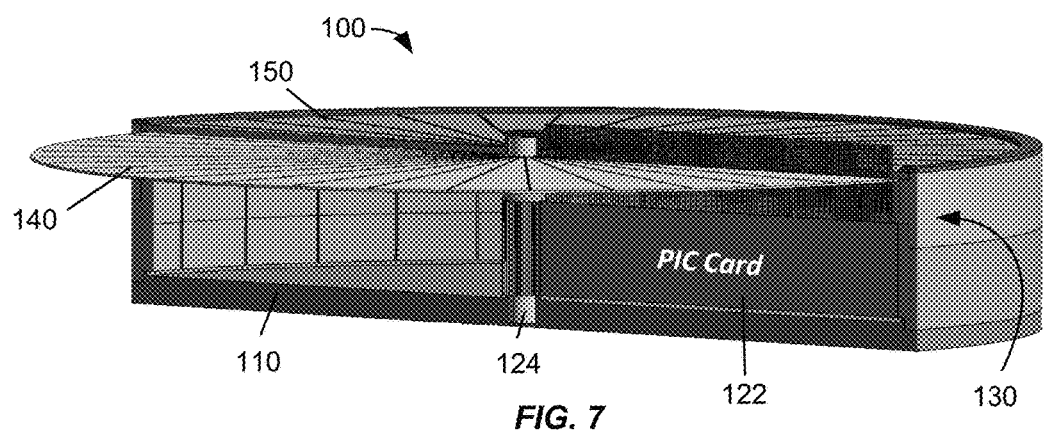
FIG. 7 is a perspective cut-away view of the imaging system of FIG. 3 in an assembled state, according to some embodiments.

FIG. 7 is a perspective cut-away view of the imaging system 100, according to some embodiments. As illustrated in FIG. 7, the PIC card 122 can be positioned in alignment with an optical axis of the lenslets of the lenslet array 140. The PIC cards 122 can be spaced apart from the lenslet array 140 along the longitudinal axis of the center hub 124. For example, the PIC cards 122 can be spaced apart using a spacer assembly 130, as illustrated in FIG. 7. In accordance with some embodiments, the separation of the back of the lenslet array 140 and the front of the PIC cards 122 can be between about 10 mm and about 30 mm, between about 15 mm and about 20 mm, or about 18 mm.

In accordance with some embodiments, the system 100 can be configured such that the PIC cards 122 process the light directed thereto from the lenslet array 140. For example, the PIC cards 122 can each collect light into a two-dimensional array of waveguides. Thereafter, the light can be demultiplexed into several spectral bins. Further, a phase shift can be applied to the light. Additionally, the light can be coherently combined into baseline pairs. In some embodiments, the combining can also comprise accounting for separation differences between lenslets. Furthermore, the PIC card 122 can also be configured to perform photo detection of complex fringe patterns.

Various material platforms can be used for performing optical processing operations with integrated photonic devices. Such materials can comprise, e.g., indium phosphide (InP), silicon (Si), silica (SiO2), silicon oxynitride (SiOxNy), and other suitable materials. Of such materials, Applicant has found that silica and silicon oxynitride both have transparency in the visible and near-infrared spectrum and demonstrate ultralow-loss waveguides (0.008~0.02 dB/cm). Furthermore, their respective fabrication processes can use CMOS-compatible fabrication equipment, which can provide a direct path to large-scale photonic integration for embodiments of the imaging system 100.

Figure 8:
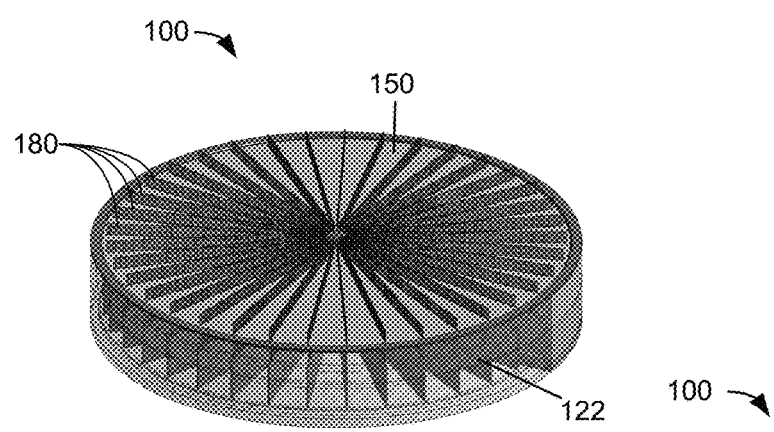
FIGS. 8-9 are perspective cut-away, top and bottom views of the imaging system of FIG. 3, according to some embodiments.
Figure 9:
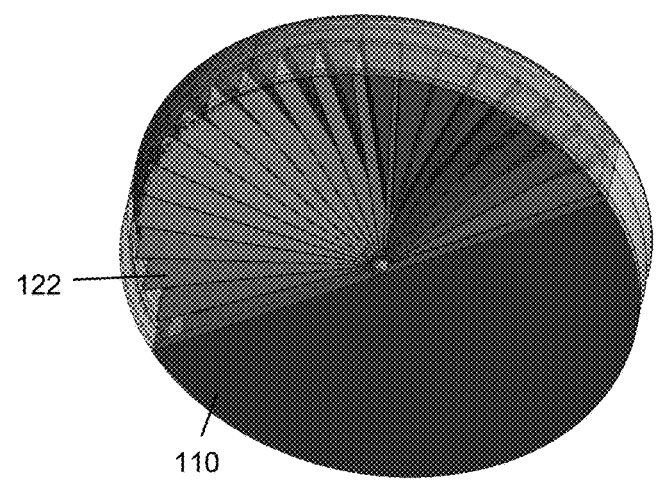

FIGS. 8-9 are perspective cut-away views of the top and bottom of the imaging system 100, according to some embodiments. FIG. 8 illustrates the system 100 in which pluralities of input light rays or beams 180 passed through the baffle front plate 150 with the input optical rays 180 being focused onto the PIC cards 122, as demonstrated in the partial cut-away of the outer ring. FIG. 9 is a partial cut-away of the system 100 along its rear plate 110 to show the PIC cards 122.

Figure 10:
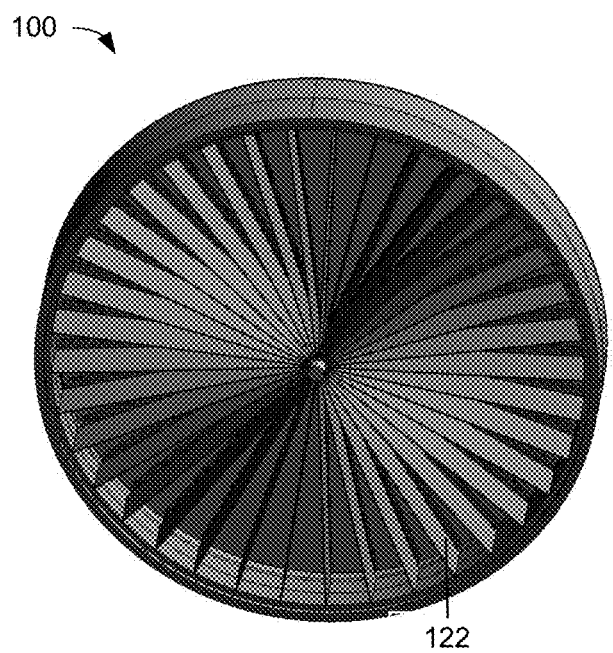
FIGS. 10-11 are perspective top and bottom views of the imaging system of FIG. 3 wherein a rear mount plate has been removed for illustration, according to some embodiments.
Figure 11:
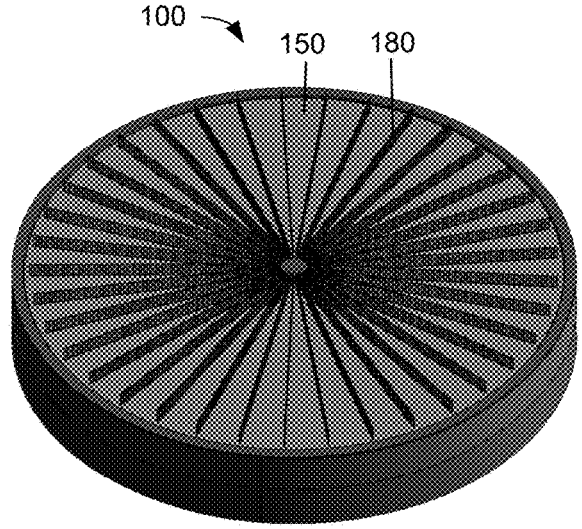

FIGS. 10-11 are perspective top and bottom views of the imaging system 100 with the rear mount plate being removed to illustrate the arrangement of the PIC cards 122 therein, according to some embodiments. FIG. 10 shows the PIC cards 122, and FIG. 11 shows the light baffle front plate 150 with the input optical rays 180.

Figure 12A:
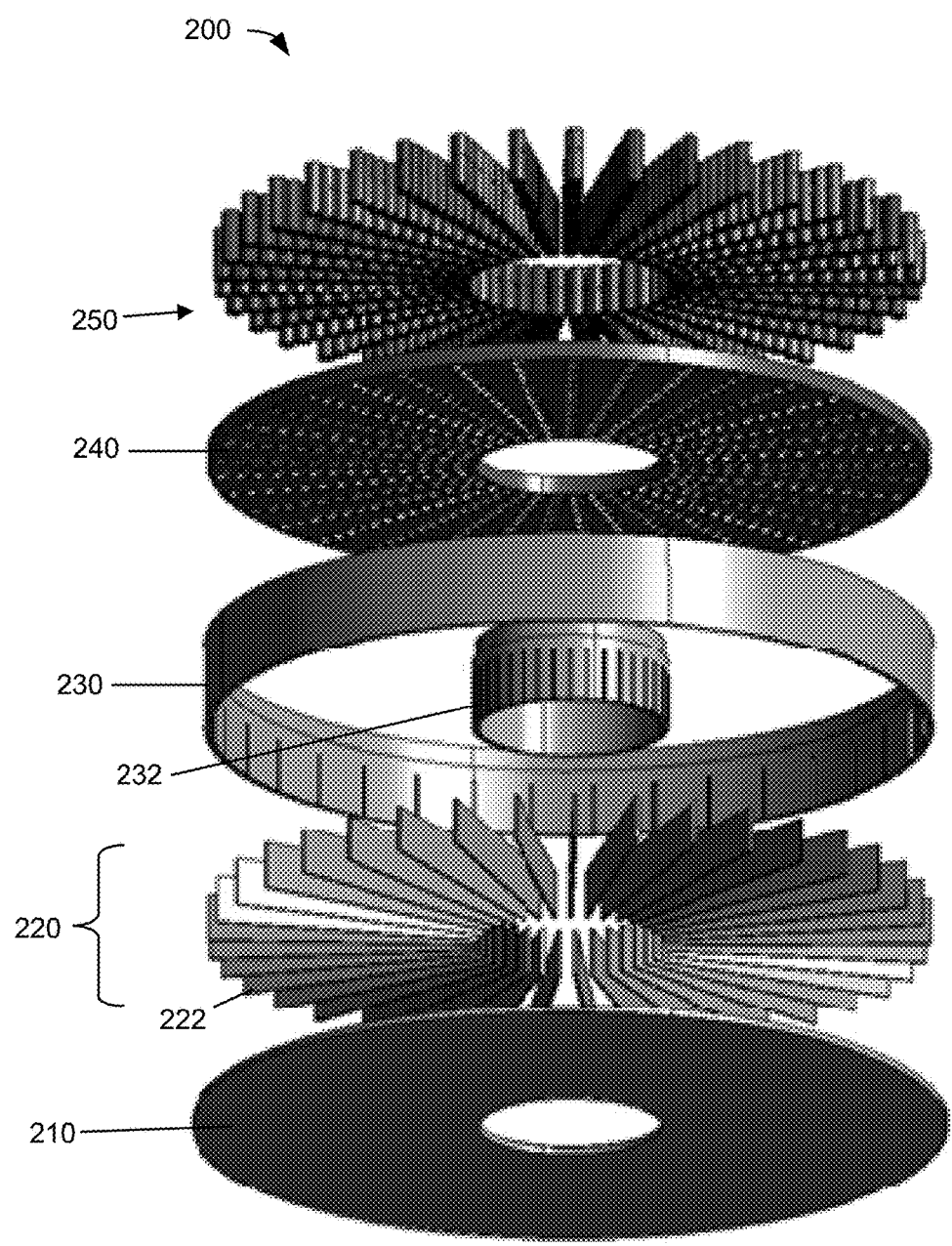
FIG. 12A is an exploded view of an imaging system, according to some embodiments.
Figure 12B:
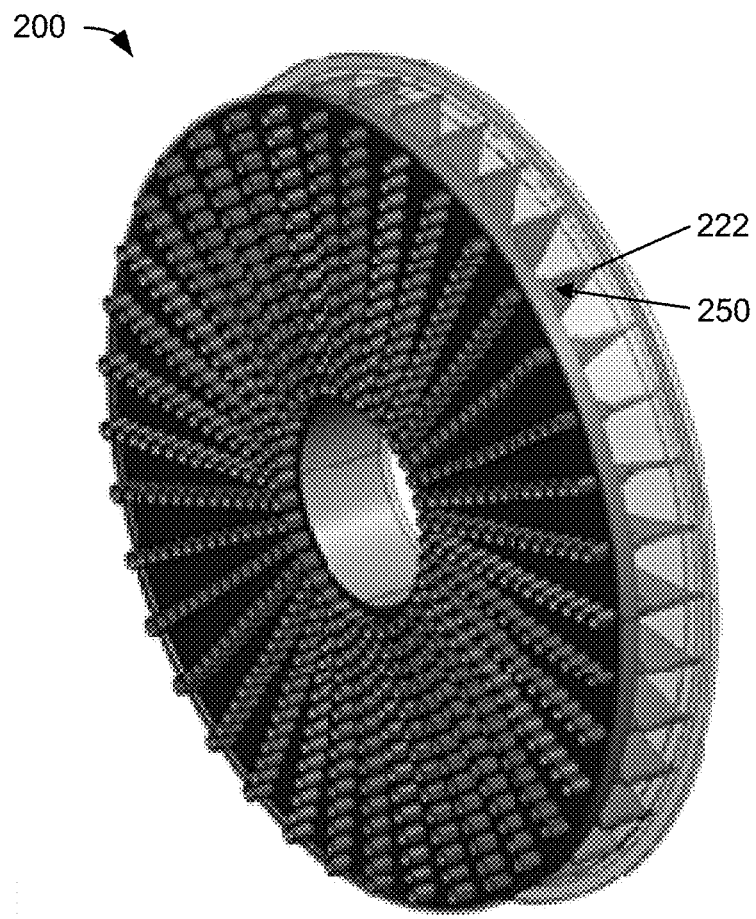
FIGS. 12B-12C are perspective and side views of the imaging system of FIG. 12A in an assembled state, according to some embodiments.
Figure 12C:
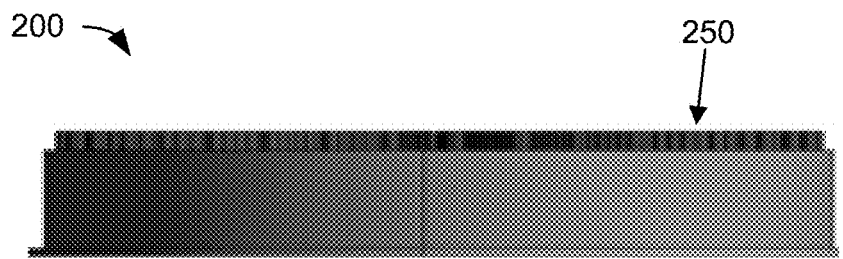
Figure 13A:
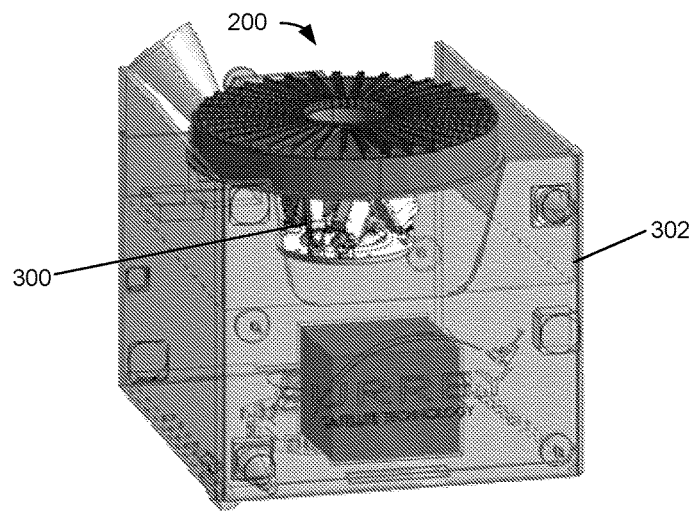
FIGS. 13A-13D are perspective and side views of a spacecraft onto which an imaging system is mounted, according to some embodiments.
Figure 13B:
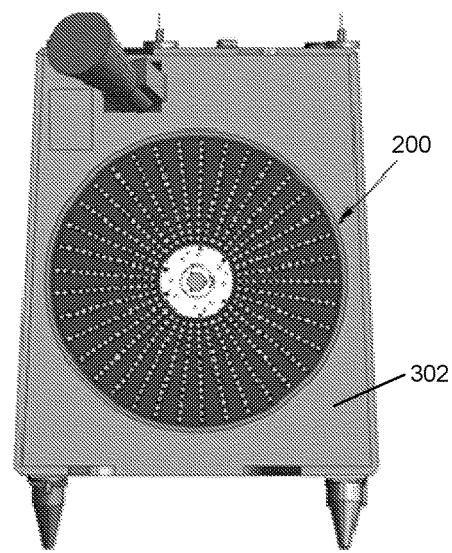
Figure 13C:
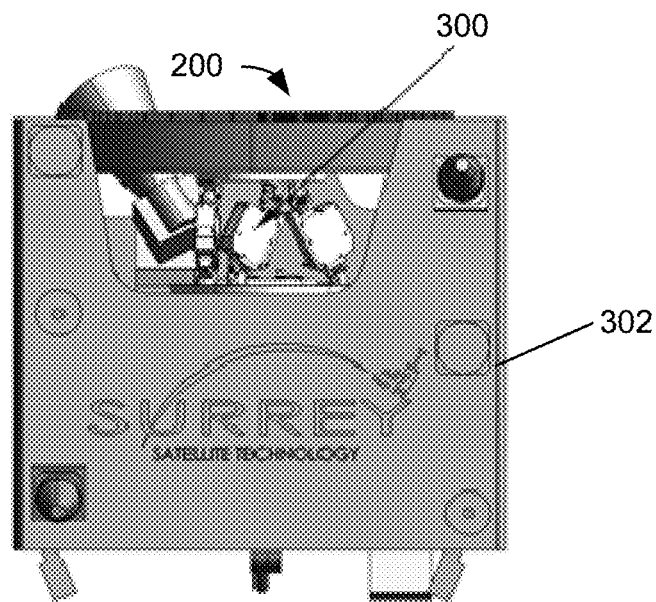
Figure 13D:
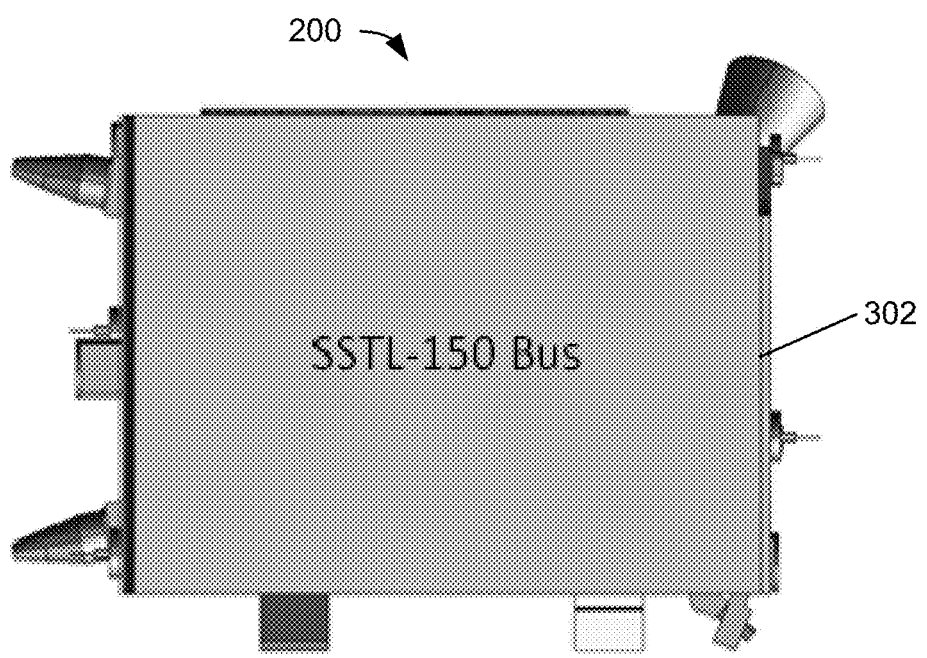

Referring now to FIGS. 12A-12C, another embodiment of an imaging system 200 is illustrated. The system 200 can comprise a plurality of lenslet arrays and a plurality of PIC cards. The lenslet arrays can be aligned with one or more PIC cards.

Similar to the system 100 discussed above, FIG. 12A, illustrates that the system 200 can comprise, from rear to front, a rear mounting plate 210, a plurality 220 of PIC cards 222, an outer spacer component 230, an inner spacer component or center hub 232, a lenslet array plate 240, and a plurality of lenslet arrays 250. The plurality 220 of PIC cards 222 can be held in position by the center hub to 32 and the outer spacer component 230, which can comprise corresponding engagement features, such as grooves or protrusions that can engage with the PIC cards 222 for positioning the PIC cards therein.

The lenslet array plate 240 can be configured to be coupled with or support the lenslet arrays 250. For example, in the illustrated embodiment, the array plate 240 can be configured to support 259 lenslet arrays 250. Each of the lenslets of the lenslet arrays 250 can be configured to comprise a 1 cm aperture interferometers (paired) on individual baselines, each in a separate interferometer tube assemblies. The system 200 can also support 37 silicon PIC cards 222. The PIC cards 222 can be mounted such that the alignment is maintained between the lenslet arrays 250. The assembly process can be performed using alignment fixtures in concert with stake-bonding features to ensure operational stability.

FIGS. 12B-12C illustrate perspective and side views of the system 200 in an assembled state. As shown in FIG. 12B, the PIC cards 222 can oriented such that they are aligned with the optical axis or propagation axis of each of the respective lenslet arrays 250 (i.e., to facilitate light injection into the waveguides). In accordance with some embodiments, the assembly 200 can comprise a diameter of between about 50 cm and about 100 cm, between about 60 cm and about 80 cm, or about 64.4 cm. Further, the height or thickness of the assembly 200 can be between about 8 cm to about 12 cm, between about 9 cm to about 10 cm, or about 9.6 cm. As illustrated FIG. 12C, the assembly 200 can be compact, with a lightweight payload that is capable of use on various vehicles or devices.

For example, FIG. 13 illustrates that the assembly 200 can be supported on a hexapod 300 and a spacecraft 302, according to some embodiments. See Surrey Satellite Technology, US LLC (Spacecraft Bus) and PI (Physik Instrumente), www.pi.ws (Hexapod Assembly). In some implementations, an MLI blanket can also be used to adequately protect the assembly from harsh environments. An actuated hexapod provides the global Field of Regard (FOR) steering. A Physik Intrumente M-824 Hexapod Assembly is shown, though this unit is not flight-qualified. MLI blankets and fiber/electrical harnessing are not shown.

An example set of imaging system design parameters is shown in Table 1.

TABLE 1

| parameter | value | units |
|---|---|---|
| lamda (low) | 5.00E−07 | meters |
| lamda (high) | 9.00E−07 | meters |
| effective diameter | 0.20 | meters |
| optical Q | 2.00 | |
| altitude | 3.00E+05 | meters |
| x and y ground area coverage | 5.00E+03 | meters |
| diagonal | 7.07E+03 | meters |
| FOV | 1.18E−02 | radians |
| FOV | 0.68 | degrees |
| GRD | 0.53 | meters |
| lenslet diameter | 1.00E−03 | meters |
| lenslet GRD | 210.00 | meters |
| number of wavegudes per lenslet (X) | 24 | |
| number of wavegudes per lenslet (Y) | 24 | |
| number of lenslets | 130.00 | |
| lenslet f/number | 18.00 | |
| focal length | 1.80E−02 | meters |
| "pixel" size | 2.5E−05 | meters |
| waveguide array dimension (X) | 6.0E−04 | meters |
| waveguide array dimension (Y) | 6.0E−04 | meters |
| number of uv slices | 37.00 | |
| number of spectral bins | 10.00 | |
| spectral bin bandwidth | 40.00 | nm |
| total collecting area | 3.78E−03 | m^2 |
| effective fill factor | 0.12 | |
| total number of detectors | 1.36E+07 | |

Some embodiments of the imaging system can therefore substantially reduce the SWaP of an imaging system compared to an equivalent conventional system. In addition, some embodiments of the system disclosed herein can be substantially less sensitive to thermal variations, thereby allowing additional reductions in the SWaP of ancillary systems, such as thermal control, power, and mechanical structure.

Simulation Results

Applicant conducted image simulations to illustrate the imaging capabilities of some embodiments disclosed herein. System parameters used for the simulations are given in Table 2 below. The field-of-view of an individual image tile is approximately twice the resolvable spot size of an individual lenslet, i.e., $$FOV_{tile} = 2\frac{\bar{\lambda}z}{D} = 20 \text{ m}, \quad (1)$$

where $\bar{\lambda}$ is the mean wavelength, z is the object distance, and D is the lenslet diameter. The system parameters were chosen to obtain $FOV_{tile}$=20 m with the intention of imaging ~10 m wide satellites. FIG. 14 shows the 2D arrangement of lenslets in the pupil plane and the resulting u-v spatial frequency coverage. The system resolution is given approximately by $$R = \frac{\bar{\lambda}z}{B_{max}} = 0.35 \text{ m}, \quad (2)$$

where $B_{max}$ is the longest interferometric baseline.

TABLE 2

| Parameter | Value |
| --- | --- |
| Waveband | 500-900 nm |
| Object Distance | 250 km |
| Lenslet Diameter | 8.75 mm |
| Longest Baseline | 0.5 m |
| Number of Lenslets per PIC card | 24 |
| Number of PIC cards | 37 |
| Number of Spectral Bins | 10 |

Figure 14B:
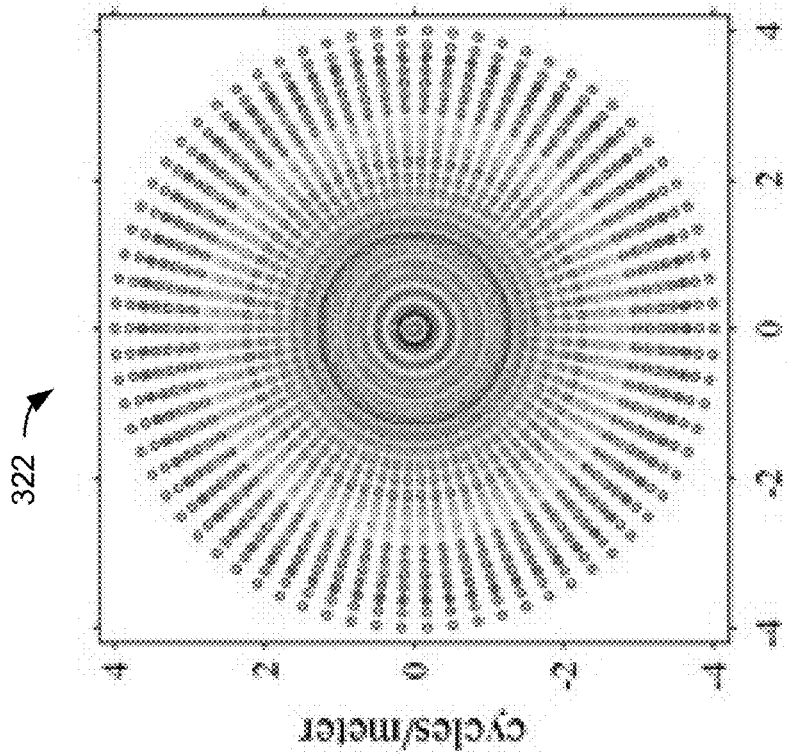
FIGS. 14A-14B illustrate schematic views of lenslet assemblies of an imaging system and corresponding u-v spatial frequency coverage, according to some embodiments.
Figure 14A:
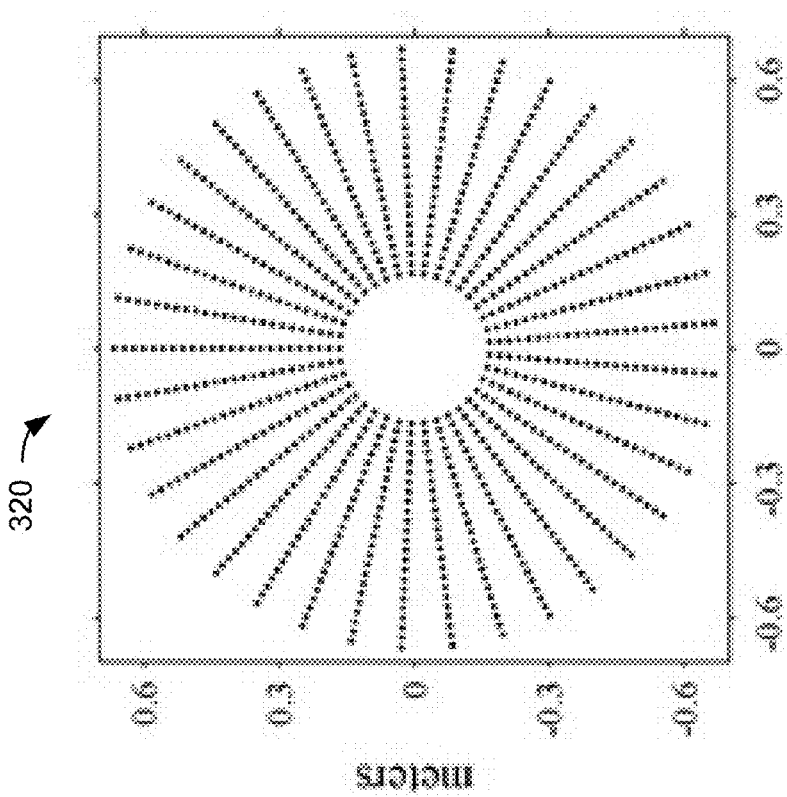

FIGS. 14A-14B illustrate a two-dimensional arrangement of lenslets 320 and corresponding u-v spatial frequency coverage 322. The increased u-v coverage provided by broadband light is indicated by the different color data points, which are shown in circumferential bands extending radially outward from the center of the pattern.

For image simulations, noiseless image data was generated by computing the complex-valued, Fourier-transform samples of an input object scene for the u-v points shown in FIG. 14B. An image was reconstructed from this data and physical constraints using a nonlinear optimization approach. The reconstructed image pixel values were iteratively adjusted to minimize a merit function that contained terms based on the data consistency, image compactness, and nonnegativity.

Figure 15C:
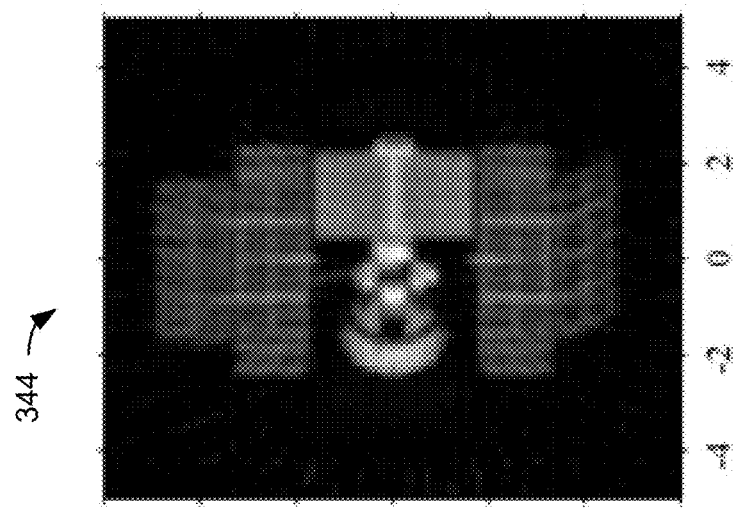
FIG. 15C illustrates an image reconstruction of the satellite of FIG. 15A using an embodiment of an imaging system disclosed herein.
Figure 15B:
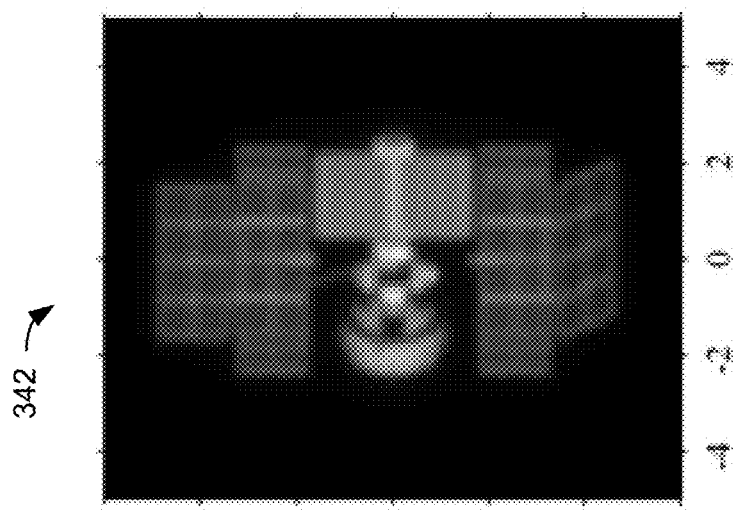
FIG. 15B illustrates an image reconstruction of the satellite of FIG. 15A using a conventional imaging system.
Figure 15A:
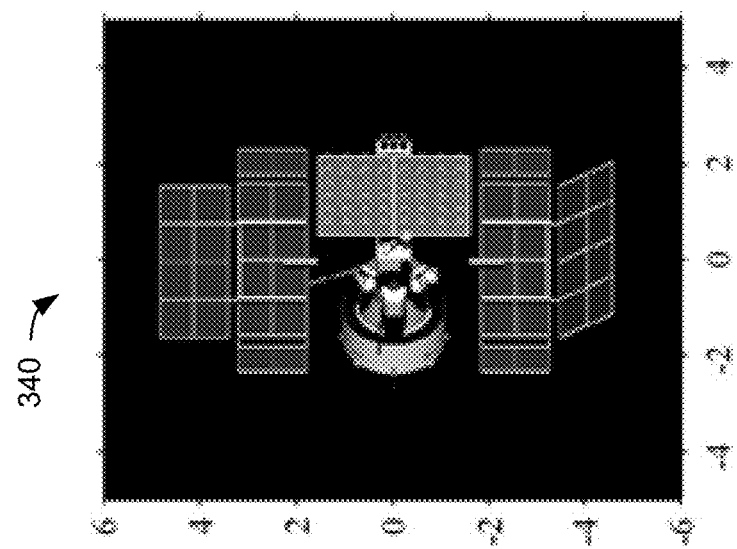
FIG. 15A illustrates a target scene of an individual satellite.

FIGS. 15A-15C illustrate simulation results for imaging of an individual satellite. FIG. 15A illustrates a pristine target scene 340 used as input for the simulation. FIG. 15B illustrates an unfiltered reference image 342 from a conventional filled aperture (diameter=0.5 m) system. Finally, FIG. 15C illustrates an image reconstruction 344, which can be achieved as an implementation of some embodiments disclosed herein. The images shown cover a 12×10 m area at the target. Although the image reconstruction 344 exhibits a few artifacts, it is comparable to the conventional image 342. However, the image reconstruction 344 has been achieved using a much more compact and lightweight system.

Figures 16A, 16B, 16C, 16D, 16E:
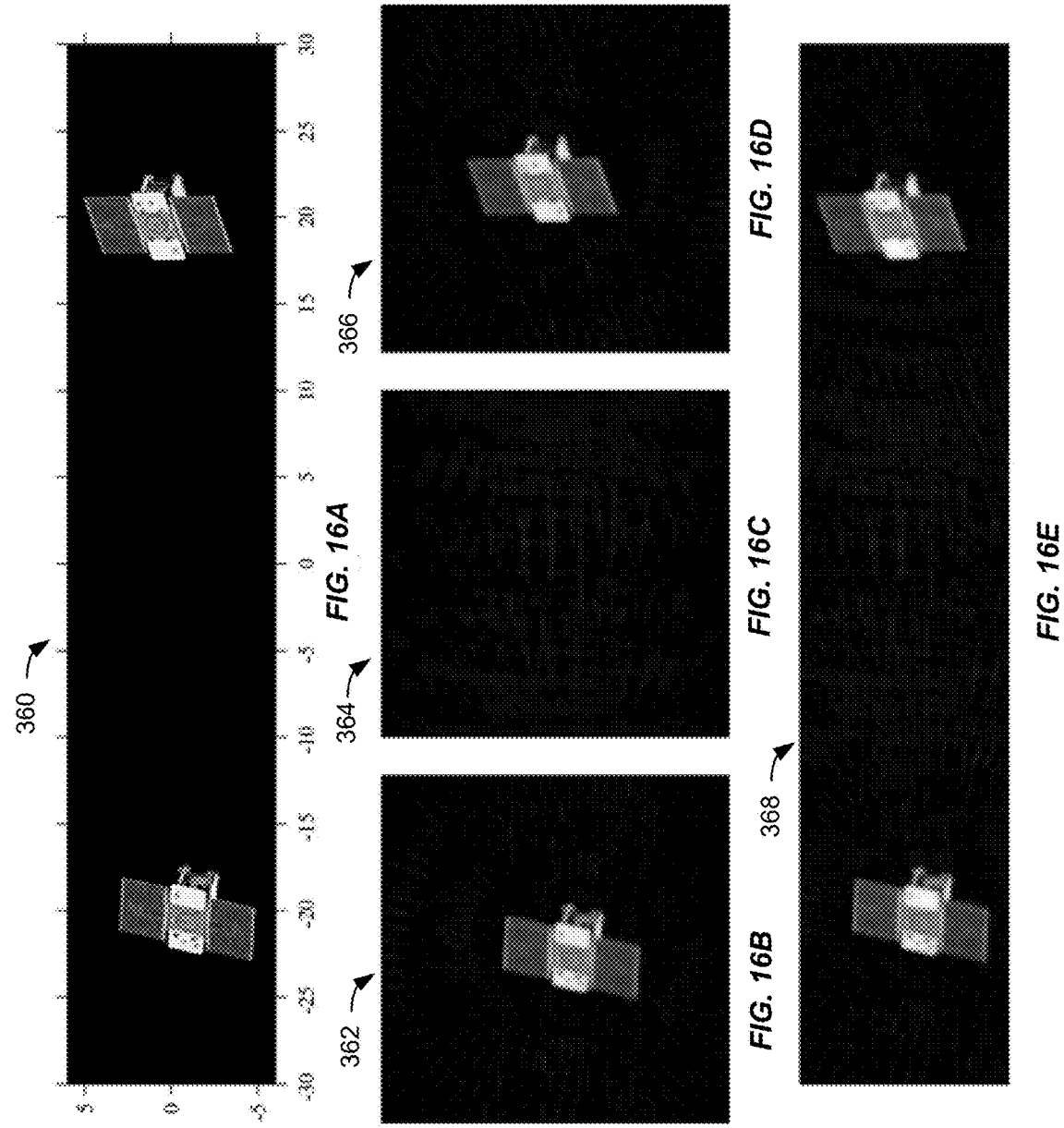
FIGS. 16A-16E illustrate simulation results for wide field of view imaging of multiple satellites, according to some embodiments.

In accordance with some embodiments, FIGS. 16A-16E compare a pristine target with the results for wide-FOV imaging, using the waveguide arrays behind each lenslet. FIG. 16A illustrates a pristine two-satellite input scene 360 covering an area of 12×30 m, which is wider than $FOV_{tile}$=20 m (the field-of-view of an individual tile image). FIGS. 16B-16D illustrate individual image tiles 362, 364, 366 that can be obtained, according to some embodiments, from using neighboring waveguides behind each lenslet. In contrast to the NPOI, the data for image tiles 362, 364, 366 in FIGS. 16B-16D can be collected simultaneously from light coupled into neighboring waveguides in the focal plane of individual lenslets. Each tile image 362, 364, 366 of FIGS. 16B-16D covers a different portion of the scene shown in FIG. 16A. The tile images 362, 364, 366 of FIGS. 16B-16D were then stitched together to form the wide-FOV mosaic image 368 shown in FIG. 16E. In accordance with some embodiments, the fidelity of the imaging can be improved by including a detailed noise model and reducing the artifacts in reconstructed imagery.

EXPERIMENTAL RESULTS

Experiments were run to demonstrate the effectiveness of an imaging system constructed in accordance with some embodiments disclosed herein. A testbed was built to demonstrate an interferometer operating at 1550 nm, entirely in-fiber from the collection apertures to the detector. The testbed functioned as a pathfinder for identifying potential issues with visibility calibration, phase vibrations, and crosstalk effects. The testbed is described below, in the order that photons travel through the instrument.

The experiment hardware included a 1 meter scene generator, 45 mm fiber collimators on actuated mounts, and a fiber-based beam combiner that performs the function of a PIC card.

Beginning at the scene generator, a 20 nm bandwidth fiber coupled light source (Bluefire FPS6123 C+L Band) illuminated a linear array of 8 PM fibers, furnishing one or more point sources, spaced at 250 micrometer intervals. An extended scene was provided via a 150 watt quartz-tungsten-halogen fiber bundle illuminator (Thorlabs OSL1), which focused onto a glass light pipe instead of a fiber bundle. The light pipe terminated behind a glass slide overlaid with a Ronchi ruling in chrome. The point source array and extended scene were mounted in parallel on an automated linear stage (Newport ILS250PP), which allows for accurate and repeatable switching between the alignment point source and extended scene. The position of the point source on the extended scene was documented via a scene inspection camera that was inserted kinematically in front of the scene. A linear polarizer was placed in the beam immediately following the scene.

The scene sat at the focus of a 1-meter f/100 Cassegrain telescope, mounted horizontally. Such a slow telescope was useful because the scenes are on a scale of tens of millimeters, allowing for a large dynamic range of spatial frequencies in the scene while keeping slide manufacturing artifacts beyond the resolution limit of the system. The drawback of such a long focal length was that the cone of light output by the scene generator greatly overfilled the collimator secondary mirror, coupling only a small fraction of the available light into the collimator. If the aperture of the system under test were very small, it can be difficult to provide enough photons while avoiding partial coherence effects.

The collection telescopes of the fiber interferometer were 45 mm diameter fiber collimators (Microlaser FC45) mounted on picomotor-driven tip-tilt stages for fine adjustment of telescope angle and light injection into the fibers. One of the two collection telescopes is mounted on an automated stage (Newport ILS250PP) which allows continuous variation of the telescope center-to-center separation from 65 to 665 mm.

The optical fiber beam combination hardware performed the function of the PIC card. The individual components in the fiber combiner included, affixed immediately to the rear port of each collection telescope, an in-line fiber polarizer (Newport F-ILP-2-N-SP-FP), followed by a PM fiber pigtail to transport the light to a breadboard containing the fiber beam combiner and detectors. The first component on the breadboard was a piezoelectric PM fiber stretcher delay line (General Photonics FST-002-FC/APC) for each input channel. The fiber stretchers had different internal lengths approximating 33 meters, each providing 4 mm of delay range. Coarse delay through the interferometer was equalized by measuring the length of all components with an Optical Backscatter Reflectometer (Luna OBR 4200), then having custom jumpers made such that all internal path lengths from telescope to beam combination added up equally. An extra degree of coarse delay adjustment was achieved by manually sliding the monolithic collecting telescopes in their mounts along their optical axes.

After the delay lines, each channel passed through a 50/50 2×2 PM fiber combiner (Newport F-PMC-1550-50) which split off half of the light as a photometric monitor channel. These photometric splits were followed by another identical 50/50 2×2 PM fiber combiner, which served as the main beam combiner, interfering the light between the two telescopes and producing two outputs with interference fringes 180 degrees out of phase from each other. The beam combiner outputs and the two photometric channels were routed into single pixel detectors (Newport 2153 IR Femtowatt Photoreciever).

To measure fringes, one delay line was swept through a hysteresis-corrected range several times larger than the source coherence length, and the photorecievers were read out at high bandwidth, producing repeated data sets of fringe amplitude versus delay through the entire fringe packet. Photometric channels were used to instantaneously normalize the fringe channel intensities as fiber coupling efficiency in each collecting telescope changes with time.

The system was controlled by a Linux PC containing a 24-bit digitizer (General Standards 24DSI16WRC) to sample the femtowatt receivers and a 16-bit analog output board for actuating the fiber delay lines. Remaining system hardware included linear motion stages (baseline and scene), Pico tip/tilt control for collimators, and scene inspection camera that were interfaced through a GigE network. Aaxeon serial servers were used to adapt the linear stage DB-9 connections to a networked environment. A software tool was written in C++ using the Qt UI framework and the Qwt library for scientific UI widgets to perform all system control from a single console. This can enable automation of labor intensive data collections.

A sinusoidally varying scene (Ronchi ruling) was used as the first step in demonstrating extended scene imaging. According to some embodiments, a sinusoidal scene should result in a peak in the visibilities at the point that the baseline between the two imaging fiber collimators corresponds with the spatial frequency presented by the pattern. With the focal length of the scene projector, the 1 cycle/mm sinusoidal pattern should correspond to a peak in the visibility with a baseline of about 150 mm.

Figure 17:
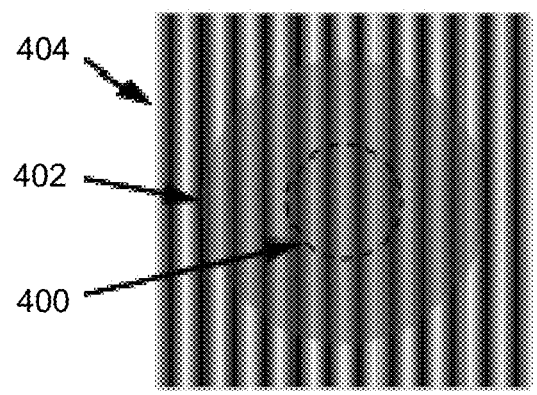
FIG. 17 illustrates a scene projector object for testing extended object imaging, according to some embodiments.

The scene projector object that is used to test extended object imaging is shown in FIG. 17. The fiber coupled to the fiber collimator field of view is shown as a dotted circle 400 inside the illumination profile 402 on the transparently slide 404. The scene is a sinusoidally varying gradient typically used as a Ronchi grating.

Figure 18:
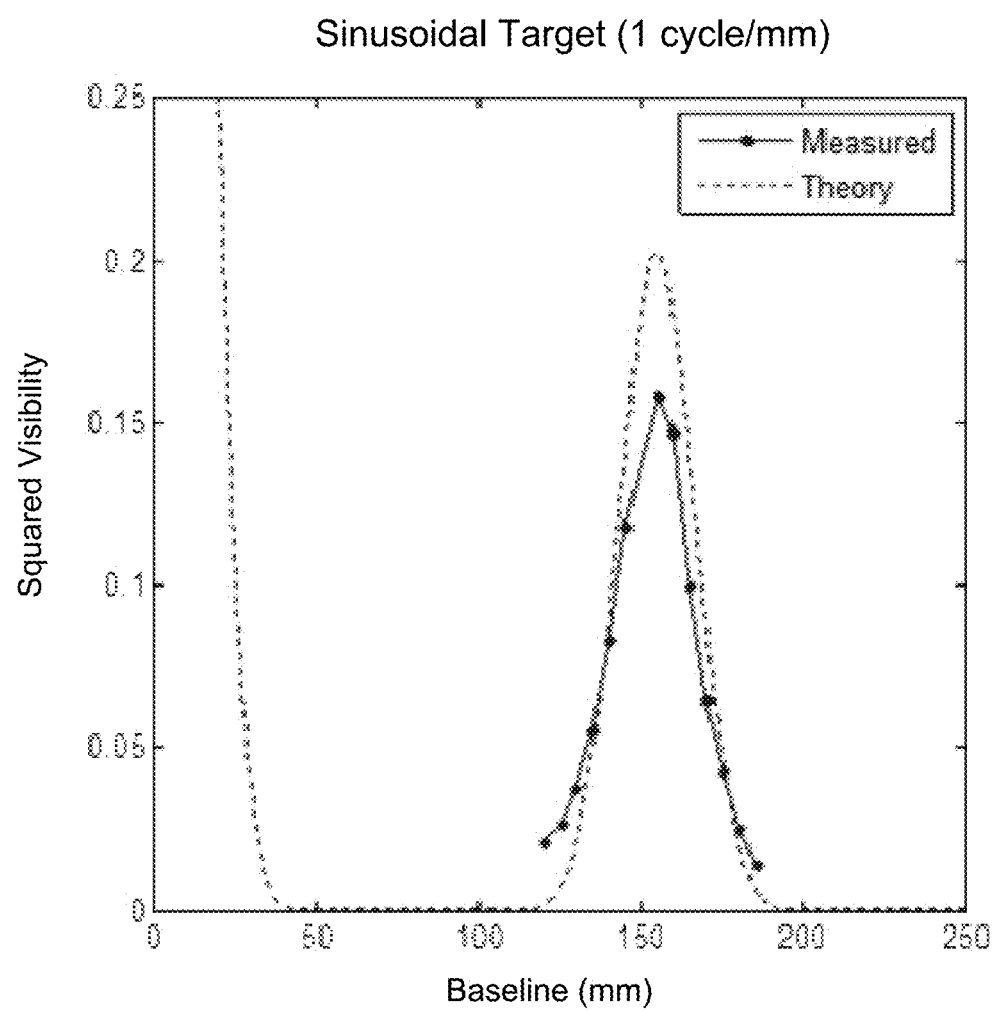
FIG. 18 illustrates a graph of experimental visibility data, according to some embodiments.

Accordance with some embodiments, FIG. 18 illustrates a graphic plot of the results when using the sinusoidal target and illumination profile shown in FIG. 17. FIG. 18 plots simulated squared visibilities compared to the experimental values. The visibility is measured at each telescope separation distance, as shown along the horizontal axis of the plot in FIG. 18. When the spacing between the fiber coupled collimators resolves the 1 cycle per mm, the visibility is peaked. With the 100 meter focal length of the scene projector, the 1 cycle/mm translates into 1 cycle per 10 micro-radians. The 10 micro-radians corresponds to a telescope separation of D=155 mm and a wavelength of $\lambda$=1.55 microns giving a VD of 10 micro-radians. The plot in FIG. 18 shows that the peak visibility is indeed at a telescope separation of 155 mm. The reduced visibility in the experimental data is due to a combination of systematic errors coupled with effects from imaging an extended scene with spatial coherence in the illumination source.

As disclosed herein, some embodiments provide systems that can utilize nanophotonics and MEMs technology to provide applications that involve collecting photons from external sources and processing them on a PIC card to form computational images rather than the traditional approach that directly forms an image on a digital focal plane with a large, bulky optical telescope. As such, some embodiments present an exciting and revolutionary advancements in the field that can have substantial impact on future space-based sensors. As a further advantage, some embodiments can be implemented to provide space surveillance sensors in a cost and schedule constrained environment. Additionally, some embodiments disclosed herein provide a revolutionary electro-optical (EO) sensor that is a compact alternative to the traditional EO imaging sensor by dramatically reducing size, weight, power, schedule, and integration and test complexity through the elimination of the manufacture, polishing, and alignment of the large optics required by conventional EO sensors.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

Although the relationships among various components are described herein and/or are illustrated as being orthogonal or perpendicular, those components can be arranged in other configurations in some embodiments. For example, the angles formed between the referenced components can be greater or less than 90 degrees in some embodiments.

There may be many other ways to implement the subject technology. Various functions and elements described herein may be partitioned differently from those shown without departing from the scope of the subject technology. Various modifications to these aspects will be readily apparent to those skilled in the art, and generic principles defined herein may be applied to other aspects. Thus, many changes and modifications may be made to the subject technology, by one having ordinary skill in the art, without departing from the scope of the subject technology.

It is understood that the specific order or hierarchy of steps in the processes disclosed is an illustration of exemplifying approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An optical imaging system, comprising:
   a plurality of lenslet assemblies positioned to surround a central aperture of the system, the plurality of lenslet assemblies being arranged to form a ring around the central aperture and a series of rows extending radially from the ring to form a lenslet array, each lenslet assembly being configured to receive broadband light and focus the light onto a focus point;
   a plurality of photonic integrated circuit (PIC) cards extending radially from the central aperture of the system, each PIC card having an edge positioned adjacent to a corresponding row of lenslet assemblies of the lenslet array, each PIC card having a plurality of waveguides, each waveguide comprising a proximal end disposed at the focus point of a respective lenslet assembly, each waveguide defining an optical path for propagation of the light; and a plurality of detectors disposed along the optical path and configured to receive and measure the light.

2. The system of claim 1, further comprising a plurality of arrayed waveguide gratings, upstream of the plurality of detectors, for separating the light directed from each lenslet assembly into separate spectral bins, light from the separate spectral bins being propagated through respective waveguides toward the plurality of detectors.

3. The system of claim 1, wherein each of the PIC cards is oriented perpendicular relative to the lenslet array.

4. The system of claim 1, wherein the plurality of lenslet assemblies forming the ring around the central aperture are positioned equidistant to each other in the ring, and wherein each of the PIC cards extends radially from a corresponding lenslet assembly positioned in the ring.

5. The system of claim 1, wherein each lenslet assembly is configured such that the focus point is on an edge of a corresponding PIC card.

6. The system of claim 3, wherein each of the plurality of PIC cards is positioned equidistant with respect to circumferentially adjacent PIC cards.

7. The system of claim 1, wherein the plurality of detectors is integrated into the a corresponding PIC card.

8. The system of claim 1, wherein each of the rows is substantially straight.

9. The system of claim 1, wherein the ring comprises a diameter of between about 20 mm and about 30 mm, wherein each lenslet assembly comprises a first lens, and wherein each first lens is disposed in a planar array.

10. The system of claim 1, wherein each lenslet assembly directs the light along a respective optical axis and at least a distal portion of each waveguide is aligned along the respective optical axis of a corresponding lenslet assembly.

11. The system of claim 10, wherein the optical axes of the plurality of lenslet assemblies are oriented parallel relative to each other.

12. An optical imaging system, comprising:

a housing having a longitudinal axis and a central aperture extending through the housing;

a plurality of lenslet assemblies supported on the housing, the plurality of lenslet assemblies being arranged to form a ring around the aperture and a series of rows extending radially from the ring to form a lenslet array, the plurality of lenslet assemblies each being aligned along respective optical axes being oriented parallel relative to the longitudinal axis, the plurality of lenslet assemblies being configured to receive broadband light and to focus the light toward a focal plane;

a plurality of photonic integrated circuit (PIC) cards extending radially from the central aperture, each PIC card having an edge positioned adjacent to a corresponding row of lenslet assemblies of the lenslet array, each PIC card having a plurality of waveguides, each waveguide having a distal end positioned at the focal plane and configured to receive the light from a respective lenslet assembly; and a plurality of detectors disposed along the optical axes for receiving and measuring the light.

13. The system of claim 12, further comprising a plurality of microchips, each microchip comprising the plurality of waveguides.

14. The system of claim 13, wherein each PIC card is substantially planar and extends substantially parallel relative to the longitudinal axis.

15. The system of claim 12, wherein the housing comprises a cylindrical shape.

16. The system of claim 12, wherein the each of the rows is substantially straight.

17. The system of claim 12, a wherein each of the plurality of PIC cards is positioned equidistant with respect to circumferentially adjacent PIC cards.

18. A method of optical imaging, comprising:

collecting broadband light using a plurality of lenslet assemblies, the plurality of lenslet assemblies being positioned about a central aperture, the lenslet assemblies being arranged to form a ring around the aperture and a series of rows extending radially from the ring to form a lenslet array;

focusing the light of each lenslet assembly onto a respective focal point such that the light is directed into a plurality of waveguides disposed in a plurality of photonic integrated circuit (PIC) cards extending radially from the central aperture, each PIC card having an edge positioned adjacent to a corresponding row of lenslet assemblies of the lenslet array;

dividing the broadband light propagated through each waveguide into a plurality of spectral bins using an arrayed waveguide grating;

combining the light from a pair of lenslet assemblies;

interfering the light from the pair of lenslet assemblies; and directing the light onto a plurality of detectors to measure the light.

19. The method of claim 18, further comprising conforming the lenslet assemblies to a two-dimensional surface.

20. The system of claim 12, wherein the ring comprises a diameter of between about 20 mm and about 30 mm.

\* \* \* \* \*